(12) United States Patent
Colla

(10) Patent No.: US 11,575,064 B2
(45) Date of Patent: Feb. 7, 2023

(54) DEVICE AND METHOD FOR CLEANING A PRINTING DEVICE

(71) Applicant: APPLIED MATERIALS ITALIA S.R.L., San Biagio di Callalta (IT)

(72) Inventor: Davide Colla, Treviso (IT)

(73) Assignee: APPLIED MATERIALS ITALIA S.R.L., San Biagio di Callalta (IT)

( * ) Notice: Subject to any disclaimer, the term of this patent is extended or adjusted under 35 U.S.C. 154(b) by 15 days.

(21) Appl. No.: 16/982,305

(22) PCT Filed: Mar. 22, 2018

(86) PCT No.: PCT/EP2018/057274
§ 371 (c)(1),
(2) Date: Sep. 18, 2020

(87) PCT Pub. No.: WO2019/179623
PCT Pub. Date: Sep. 26, 2019

(65) Prior Publication Data
US 2021/0020804 A1    Jan. 21, 2021

(51) Int. Cl.
*H01L 31/18* (2006.01)
*H01L 21/02* (2006.01)
*H01L 21/67* (2006.01)

(52) U.S. Cl.
CPC .... *H01L 31/1876* (2013.01); *H01L 21/02057* (2013.01); *H01L 21/02096* (2013.01); *H01L 21/67288* (2013.01)

(58) Field of Classification Search
CPC ........... H01L 31/1876; H01L 21/02057; H01L 21/02096; H01L 21/67288; H01L 31/18
See application file for complete search history.

(56) References Cited

U.S. PATENT DOCUMENTS

| 2013/0052334 | A1* | 2/2013 | Vercesi | H05K 3/1216 118/712 |
| 2013/0095579 | A1* | 4/2013 | Egan | H01L 31/1804 118/713 |
| 2014/0216524 | A1* | 8/2014 | Rogers | H01L 31/048 136/249 |
| 2014/0226136 | A1* | 8/2014 | Gagnon | G03F 1/82 355/30 |
| 2017/0301820 | A1* | 10/2017 | De Santi | H01L 22/10 |

FOREIGN PATENT DOCUMENTS

| CN | 102700237 B | 8/2015 |
| EP | 2592658 A1 | 5/2013 |
| GB | 2491992 A | 12/2012 |
| WO | 2017/149347 A1 | 9/2017 |

OTHER PUBLICATIONS

International Search Report and Written Opinion, PCT/EP2018/057274, dated Jan. 9, 2019.

* cited by examiner

*Primary Examiner* — Mohammed Shamsuzzaman
(74) *Attorney, Agent, or Firm* — Patterson & Sheridan, LLP

(57) ABSTRACT

An apparatus for producing semiconductor cells, the apparatus comprises a printing device for printing on a semiconductor cell, a monitoring device configured to monitor characteristics of the printed semiconductor cell, and a cleaning device configured for cleaning at least one part of the printing device based on the monitored characteristics of the semiconductor cells.

4 Claims, 9 Drawing Sheets

DEVICE AND METHOD FOR CLEANING A PRINTING DEVICE

TECHNICAL FIELD

Embodiments of the present disclosure relate to an apparatus for producing semiconductor cells. The apparatus comprises a printing device for printing on a semiconductor cell, a monitoring device configured to monitor characteristics of the printed semiconductor, and a cleaning device configured for cleaning at least one part of the printing device based on the monitored characteristics of the semiconductor cells.

BACKGROUND

Semiconductor cells are used in many fields of modern industry, for example in the electronic industry or the solar cell industry. The processes applied in the production of semiconductor cells have chemical and physical components. In addition to chemical coating processes, etching and cleaning processes, physical methods are also used, such as physical coating and cleaning processes, ion implantation, crystallization or temperature processes, like diffusion, heating and melting for example. Other processes use both chemical and physical processes such as photolithography or chemical-mechanical planarization. In addition, a wide variety of measurement methods are used for characterization and process control. For the production of (micro-) electronic circuits, semiconductor technology processes are applied in a certain sequence on a substrate. The substrate is usually a slice of a semiconductor crystal (usually silicon), for example, a wafer which is less than one millimeter thin. Especially in the production of integrated circuits, the function of electronic components and assemblies is realized in a near-surface area, for example below 100 nm in depth. In that technical field, the material properties, especially the electrical properties of the wafer are specifically modified and textured.

Screen printing has long been used in the electronic industry for printing electrical component designs, such as electrical contacts or interconnects, on the surface of a substrate. State of the art semiconductor cells, in particular solar cells for fabrication processes also use screen printing processes. Due to technical progress, the structures formed on the substrates, or on the semiconductor cells get smaller and finer enhancing the performance capabilities of the cells. For example, the industry aims to increase the efficiency of a solar cell. Due to a high demand for powerful semiconductor cells, the production of semiconductor cells becomes more complex, wherein at the same time the cost pressure increases. For precise printing, a printer has to be maintained regularly, which mainly includes a cleaning of components of the printer. Regular cleaning of a printer leads to downtime, in particular to production stops of manufacturing systems for producing semiconductor cells. The downtime results in a lower utilization of production capacities and higher costs for semiconductor cells.

In view thereof, the present disclosure aims at providing an apparatus and a method for producing semiconductor cells with a printing device that overcome at least some of the problems mentioned above. The present disclosure particularly aims at providing an apparatus for producing semiconductors that have an improved cleaning process. Furthermore, the present disclosure particularly aims to provide an improved method for cleaning the printing device in a semiconductor cell apparatus.

SUMMARY

In light of the above, an apparatus for producing semiconductor cells including a printing device, a cleaning device for cleaning a printing device, an apparatus for using a cleaning device and a method for cleaning a printing device is provided.

According to an aspect of the present disclosure, an apparatus for producing a semiconductor cell including a cleaning device for cleaning a printing device is provided.

According to a further aspect of the present disclosure, a cleaning device for cleaning a printing apparatus is provided.

According to a further aspect of the present disclosure, an apparatus for using a cleaning device is provided.

According to a further aspect of the present disclosure, a method for cleaning a printing device in a semiconductor production apparatus is provided.

BRIEF DESCRIPTION OF THE DRAWINGS

So that the manner in which the above recited features can be understood in detail, a more particular description, briefly summarized above, may be had by reference to embodiments. The accompanying drawings relate to embodiments and are described in the following figures.

DETAILED DESCRIPTION OF EMBODIMENTS

Reference will now be made in detail to the various embodiments of the disclosure, one or more examples of which are illustrated in the figures. Within the following description of the drawings, the same reference numbers referring to individual embodiments are described. Each example is provided by way of explanation of the disclosure and is not meant as a limitation. Further features illustrated or described as a part of one embodiment can be used on or in conjunction with other embodiments to yield a further embodiment. It is intended that the description includes such a modification and variations.

In the present disclosure an apparatus for producing semiconductor cells is provided. The apparatus includes a printing device for printing semiconductor cells, a monitoring device configured to monitor characteristics of the semiconductor cells, and a cleaning device configured for cleaning at least one part of the printing device based on the monitored characteristics of the semiconductor cells.

Figure 1A:
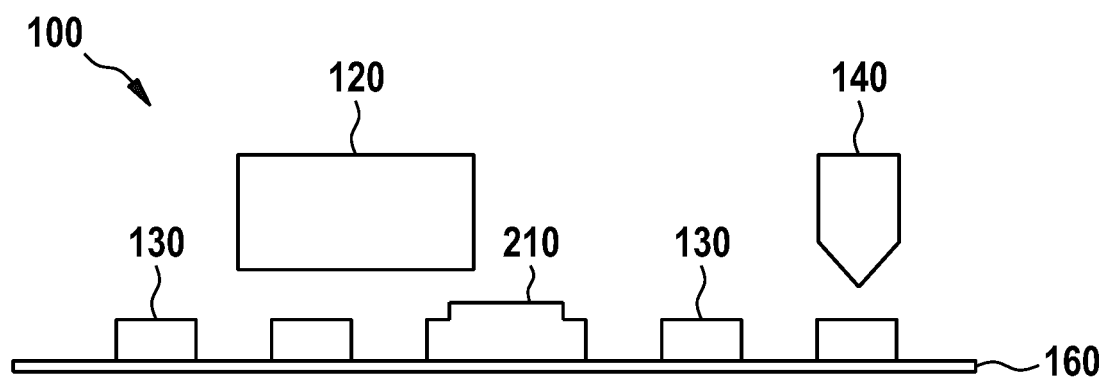
FIG. 1A shows an exemplary embodiment of an apparatus 100 for producing semiconductor cells.

With reference to FIG. 1A, an exemplary embodiment of an apparatus 100 for producing semiconductor cells is depicted. The apparatus includes a transport configuration 160, wherein the transport configuration 160 transfers the semiconductor cell 130 to a printing device 120. A monitoring device 140 is arranged at the transport configuration 160 downstream from the printing device 120. The monitoring device 140 monitors the characteristics of the semiconductor cell 130 after the printing process. Based on the monitored characteristics of the printed semiconductor cell, the cleaning device 210 carries out a cleaning of the printing device 120.

The term semiconductor cell as used in embodiments described herein can be at least one element selected from the group consisting of a conductive material, a conductive material with a silicon or alumina base, a plate, a wafer, a semiconductor wafer, a semiconductor, a solar cell wafer, a Si wafer, a Si solar cell wafer, a green-tape circuit board, and similar articles, particularly used to form photovoltaic cells or green-tape circuits. For example, solar cell wafers or green-tape circuit boards can be provided as a semiconductor cell. The terms semiconductor cell, cell, semiconductor or solar cell can be used synonymously herein.

Figure 1B:
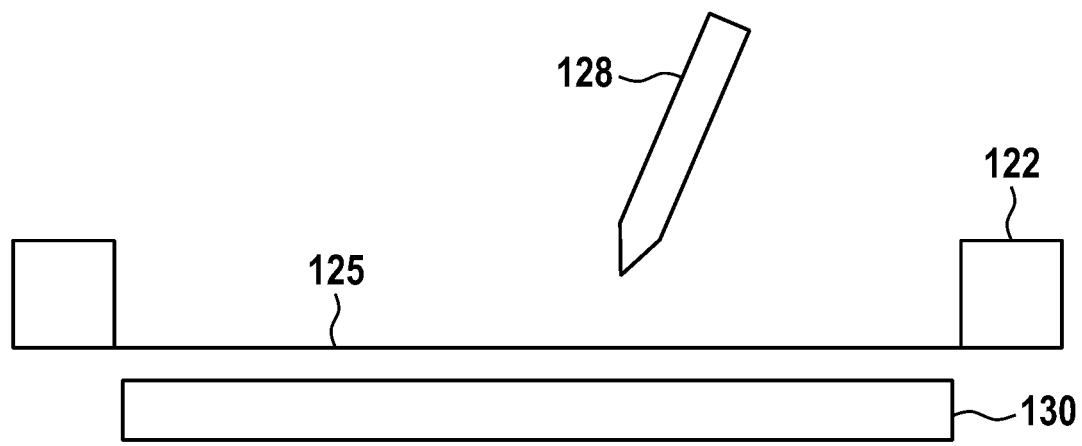
FIG. 1B illustrates an exemplary design of a printing device.

A printing device can be understood as a device for printing on a semiconductor cell, wherein printing includes putting a material, such as a paste containing metal or dielectric materials or the like, on the semiconductor cell. FIG. 1B is used to illustrate an exemplary design of a printing device. The printing device 120 includes a printing chamber 122 with at least one printing tool 128 and a printing mask 125, e.g. a printing screen 125. The printing tool 128 can be understood as a tool for applying the material (not shown.) to be deposited on the semiconductor cell 130. The printing tool 128 urges the material to be deposited on the semiconductor cell 130 through the printing screen 125. The printing tool can be understood, for example, as a squeegee 128, which can be moved from one end of the printing screen 125 to the other end of the printing screen. By applying a force on the printing screen 125, the printing tool 128 applies the material on the semiconductor cell 130 positioned below the printing screen 125.

The monitoring device can be understood as a sensor assembly including at least one sensor unit. A sensor unit can be at least one element selected from the group consisting of a laser scanner, a tracking device, an electromagnetic sensor, an optical sensor, an optical vision system, an optical inspection unit or an acoustic sensor and the like. The monitoring process can be operated by using a multitude of sensor units. The monitoring device can be arranged at or in proximity to the transporting path or along one or more sections of the transporting path. The monitoring device can also be arranged in close proximity or adjacent to the printing device.

The term characteristics of the printed semiconductor cell can be understood as the physical properties, for example, the electronic, the mechanical, the optical or the material composition properties or the like of the printed semiconductor cells. In particular, the characteristics of the semiconductor cell are monitored by monitoring the surface of the printed semiconductor cells. The characteristics of the semiconductor cell can include at least one parameter of the aforementioned physical properties, for example, thickness, material composition, irregularities, defects, print quality defects and impurities of a printed semiconductor cell. The characteristics can further include printed patterns, which affects for example the conductivity and the efficiency of a semiconductor cell.

The cleaning device can be understood as a device, which is capable of cleaning at least one part of the printing device. The cleaning device can further be understood as a cleaning assembly including more than one cleaning device, wherein one cleaning device of the cleaning devices is configured to clean a part of the printing device. The cleaning device can be adapted to a specific part or to a specific component of the printing device. The cleaning device can be for example configured to clean a mask or a screen, supply lines, inlets, a printing chamber or the like of the printing device.

The cleaning process can be for example carried out mechanically by bringing a cleaning tool such as a rubber, a tissue-like medium, a roller or a synthetic sponge and the like into contact with the respective component of the printing device to be cleaned. The movement of the cleaning device, in particular the cleaning tool can be described as rubbing, brushing, polishing or the like. Furthermore, the cleaning process can be carried out chemically by applying cleaning agents to the specific components to be cleaned. Furthermore, the cleaning process can be supported by pressure jets or the like. The different cleaning processes as described herein can also be combined or carried out simultaneously.

The cleaning device can be driven or actuated automatically or can be operated semi-automatically, for example supported by an operator. According to embodiments, the term cleaning at least one part of the printing device, can be understood as some parts or components of the printing device are cleaned, wherein some other parts of all parts or components of the printing device are not cleaned. The term cleaning at least one part of the printing device can further be understood as just a part of one component of the printing device, for example one part or area of a screen or a mask is cleaned. Further, the term cleaning at least one part of the printing device can be understood as all parts of the printing device or all components of the printing device, or all parts or areas of one component are cleaned.

The cleaning, in particular the cleaning procedure or process, carried out by the cleaning device is based on the monitored characteristics of semiconductor cells as described herein. The cleaning, in particular the cleaning process, based on the monitored characteristics can be understood as the cleaning process is started, triggered, initiated or carried out and the like based on the monitored characteristics. The monitoring device can be configured to switch on the cleaning process based on data obtained through monitoring of the semiconductor cell characteristics. The triggering of the cleaning process can be activated by comparing or checking monitored characteristics as described herein with internal settings of the characteristics stored in the monitoring device. The internal settings can include thresholds for characteristics to be monitored, wherein a comparison with the monitored characteristics of the semiconductor cells and the threshold of the characteristics of the internal settings can trigger the cleaning process. Triggering the cleaning process can also be understood such that the monitoring device controls which part of the printing device will be cleaned.

The cleaning, in particular the cleaning process or procedure can be improved by cleaning the printing device based on the monitored characteristics of the semiconductor cell as described herein. In particular, the cleaning time can be reduced by only cleaning the parts or components of the printing device causing the characteristics of the printed semiconductor cell. Furthermore, the cleaning can be made more efficient by monitoring the characteristics of the printed cells and short-term cleaning of impurities of the parts or components of the printing device. The term short-term can be understood as a time span between 1 and 15 minutes, or between 1 and 60 seconds. Moreover, the quality of the semiconductor cell can be improved. The cleaning device as described above can also save time and costs by producing less scrap.

According to embodiments, which can be combined with other embodiments described herein, a transport configuration for supplying the screen printing device with semiconductor cells is provided, wherein the transport configuration forms a transporting path for semiconductor cells between the printing device and the monitoring device. A transport configuration may be understood as a transporting module or an array of several or more transporting modules forming a transporting path for transferring semiconductor cells. The transporting path can be designed as a physical connection, for example a conveyor, a track, a shuttle or a guide rail and the like. Further, the transporting path can be formed by gripper-liked transporting modules, wherein the modules or the firing tool are arranged within an operation radius of the gripper-like module.

Figure 2A:
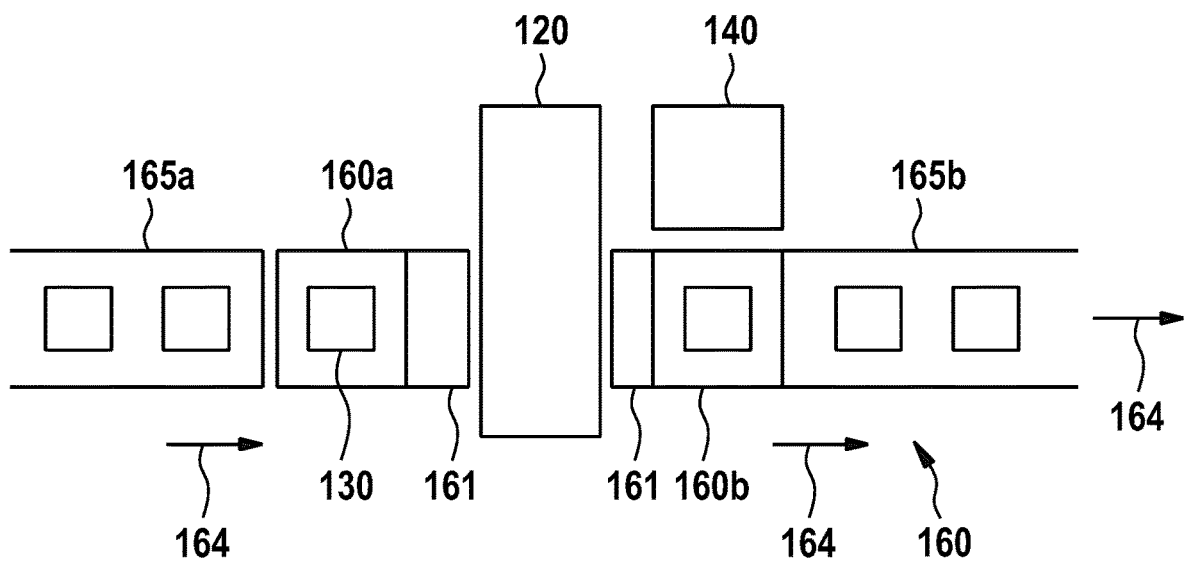
FIG. 2A shows a schematic view of an exemplary embodiment of a transport configuration 160.

FIG. 2A shows an exemplary embodiment of a transport configuration 160. The transport configuration 160 includes a conveyor 160a, or incoming conveyor 160a, which can include an actuator unit 161. The actuator unit 161 can in some embodiments be configured for example as a linear movement unit. The conveyor 160a can be configured to receive a semiconductor cell 130 from an input device, such as an input conveyor 165 and transfer the semiconductor cell 130 to the printing device 120 along a transport direction 164. The transport configuration 160 can further include an outgoing conveyor 160b, which can be configured to receive the printed semiconductor cell 130 from the printing device 120. The monitoring device 140 can be arranged at the outgoing conveyor 160b for monitoring the printed semiconductor cells 130 as described herein. The outgoing conveyor 160b can also transfer the semiconductor cells 130 to a semiconductor cell removal device, such as an exit conveyor 165b. The input conveyor 165a and the exit conveyor 165b may be part of a larger production line.

Figure 2B:
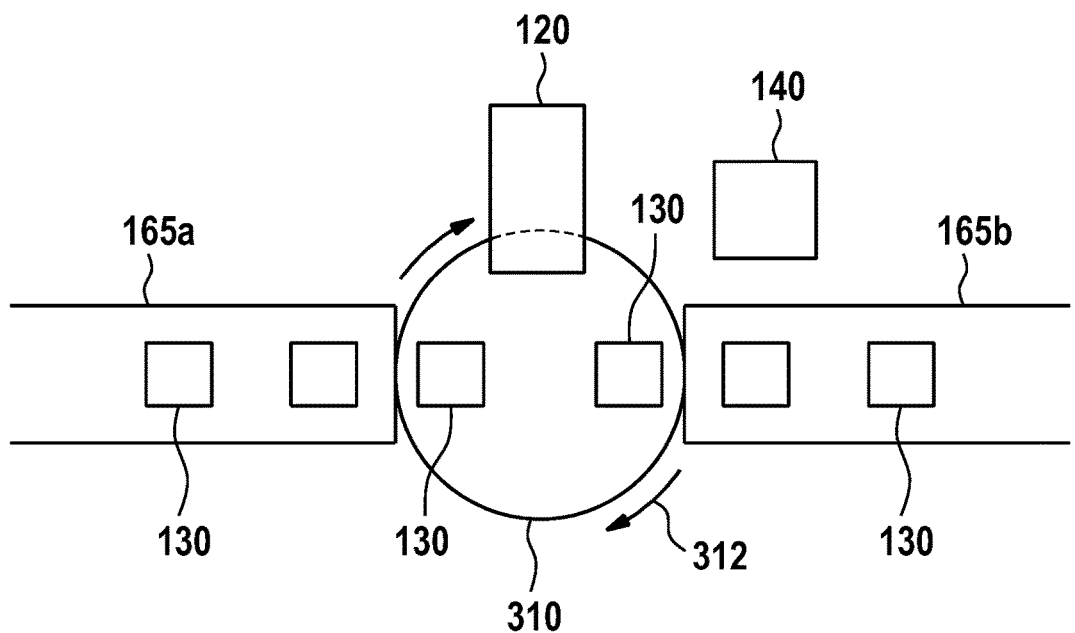
FIG. 2B shows a schematic top view of an exemplary embodiment of a transport configuration including a rotary table.

In embodiments described herein, which can be combined with other embodiments described herein, the transport configuration can include a rotary table and/or a shuttle. A rotary table can be understood for example as a transport device having a circular-shaped body, which can transfer semiconductor cells arranged on or put on the surface of the body by a rotational movement. FIG. 2B shows a schematic top view of an exemplary embodiment of a transport configuration including a rotary table. The rotary table 310 transfers semiconductor cells 130 by using a rotational movement 312 to the printing device 120. The semiconductor cells 130 can be transferred by an input device 165a, such as an input conveyor 165a, to the rotatory table 130, wherein the semiconductor cells 130 are moved by a rotation of the table to the printing device 120, in particular below the printing device 120. After printing, the cells 130 can be transferred to an exit device 165b, in particular an exit conveyor 165b for further transport or further processing. The monitoring device 140 can be arranged at the rotary table 310, in particular in proximity to the printing device 120, or more particularly between the printing device 120 and the exit conveyor 165b.

According to embodiments, which can be combined with some other embodiments described herein, a semiconductor cell support is arranged on the transport configuration, wherein the cleaning device is optionally arrangeable on the semiconductor cell support. A semiconductor cell support can also be understood as a printing nest configured to support the semiconductor cell during the printing process. The printing nest can for example be mounted, fixed or attached to the transporting configuration, wherein the printing nest serves as a transport container, to ensure a safe transport of the semiconductor cell within the apparatus. Furthermore, the printing nest is configured to support the printing process within the printing device. According to some embodiments, the printing nest can include a printing nest conveyor assembly to receive a semiconductor cell from a further transport configuration component like an input conveyor. The printing nest conveyor assembly is arranged, in particular encompassing the supporting plate, wherein the position of the semiconductor cell on the support plate can be adapted by the printing nest conveyor assembly.

According to embodiments, which can be combined with some other embodiments described herein, the cleaning device is arrangeable on the semiconductor cell support. The cleaning device can have a circle-shaped, a rectangular, or a square design, or the like. The cleaning device can include a flat surface, in particular an even lower surface, which can be placed on top of the semiconductor cell support.

Figure 3A:
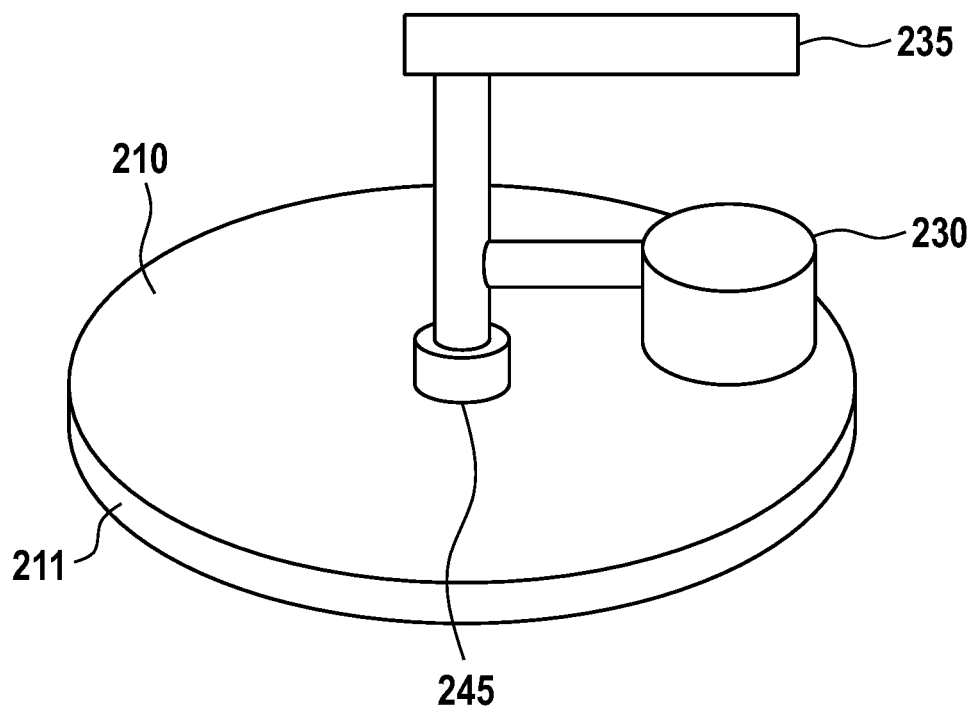
FIG. 3A shows a schematic view of an exemplary embodiment of a cleaning device.

A schematic view of an exemplary embodiment of a cleaning device is shown in FIG. 3A. The cleaning device 210 includes a base body 211, wherein a rub-unit 230 is arranged on the surface of the base body 211. The cleaning device 210 is put on the semiconductor cell support (not shown) by a cleaning support arrangement 235 provided with a support pad 245 for mounting the rub-unit 230 on the base body 211 of the cleaning device. The cleaning support arrangement 235 is further configured to arrange, in particular to put, the cleaning device 210 on the printing nest as described herein.

Figure 3B:
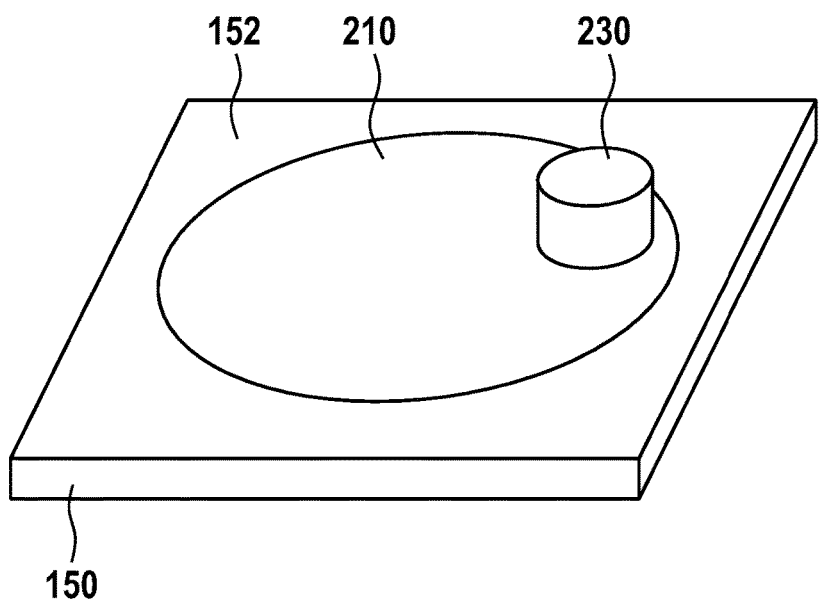
FIG. 3B shows a schematic view of an exemplary embodiment of a cleaning device arranged on a printing nest 150.

According to embodiments, which can be combined with some other embodiments described herein, the cleaning device can be stored in a "pick-&-place" position, wherein the rub-unit can be imbued with a wiping liquid to improve the cleaning effect of the cleaning device, in particular of the rub-unit. Furthermore, the cleaning device can be maintained in the "pick-&-place" position. With reference to FIG. 3B, the cleaning device 210 is arranged on a printing nest 150, in particular on the support surface 152 or support plate 152 of the printing nest. The cleaning device 210 can have a circular-shaped design with a flat surface, wherein the flat surface of the cleaning device 210, in particular of the base body 211 is in contact with the support surface of the printing nest 150. In embodiments described herein, which can be combined with other embodiments described herein, the support surface 152 can be for example a porous material that allows for retaining a semiconductor cell 130 as well as a cleaning device 210 on the printing nest 150 using a vacuum applied on the opposing side of the support surface 152 by a conventional vacuum generating device (e.g., vacuum pump, vacuum ejector).

A cleaning device being arrangeable on the printing nest can provide the advantageous effect that the cleaning device can be easily transferred to the printing device with no need for an additional transfer arrangement. The transport configuration can be used for transporting the printing nests with the semiconductor cells to the printing device and for transporting of a printing nest with a cleaning device. An already existing transporting configuration can be used for transporting the cleaning device with no need for further arrangements for transporting the cleaning device. The cleaning device can also be understood as a substitute or a "dummy" for a semiconductor cell, which can be arranged on the printing nest when specific characteristics of a printed semiconductor cell are monitored as described herein.

Figure 4:
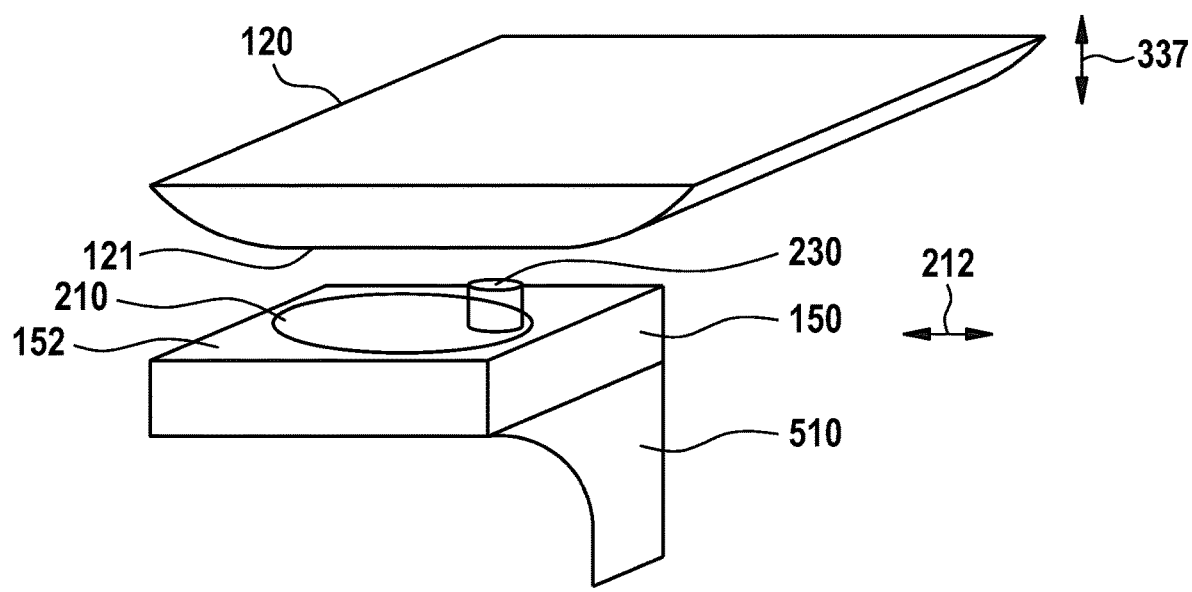
FIG. 4 shows a schematic side view of an exemplary embodiment of a transport configuration.

A schematic side view of an exemplary embodiment of a transport configuration is shown in FIG. 4. The transport configuration includes a shuttle 510 for transferring semiconductor cells to the printing device 120. The cleaning device 210 is arranged on a printing nest 150, in particular on the support surface 152 of a printing nest 152 as described herein, wherein the cleaning device 210 is moved by the shuttle 510 below the printing device 120. For starting the cleaning process, the cleaning device 210 including a rub-unit 230 is put into contact with the lower side 121 of the printing device 120 to clean at least one component (not shown) arranged at the lower side 121 of the printing device 120. For bringing the rub-unit 230 into contact with components arranged on the lower side 121 of the screen printer 120, the screen printer 120 can be lowered in Z-direction 337. Furthermore, the screen printer 120 can also be raised in Z-direction 337 to adjust the distance between the cleaning device 210, in particular between the rub-unit 230 and the lower side 121 of the screen printer 120.

The components of the screen printer to be cleaned can include a screen, e.g. a mask or a printing mask, printing chamber, outlets, jets and nozzles or the like. According to embodiments, which can be combined with other embodiments described herein, the cleaning process of the cleaning device 210 can be carried out by moving the cleaning device 210 in X-direction 212. The X-212-direction can correspond to the moving direction of the shuttle 510, wherein the movements of the shuttle 510 are transferred via the printing nest 150 to the cleaning device 210. The movement of the shuttle 510 can be used for the cleaning process, wherein the rub-unit 230 is moved with respect to the lower side 121 of the screen printer 120. The movement of the cleaning process carried out by the cleaning device 210 can be understood as a back and forth movement in X-direction, wherein the back and forth movement can be repeated more than once and the back and forth movement corresponds with the back and forth movement in X-direction 212 of the shuttle 510. By using the X-movement 212 of the shuttle 510 for the cleaning movement a further actuator for the cleaning device 210 can be omitted, which enables a simple and cost effective design of the cleaning device 210.

Figure 5:
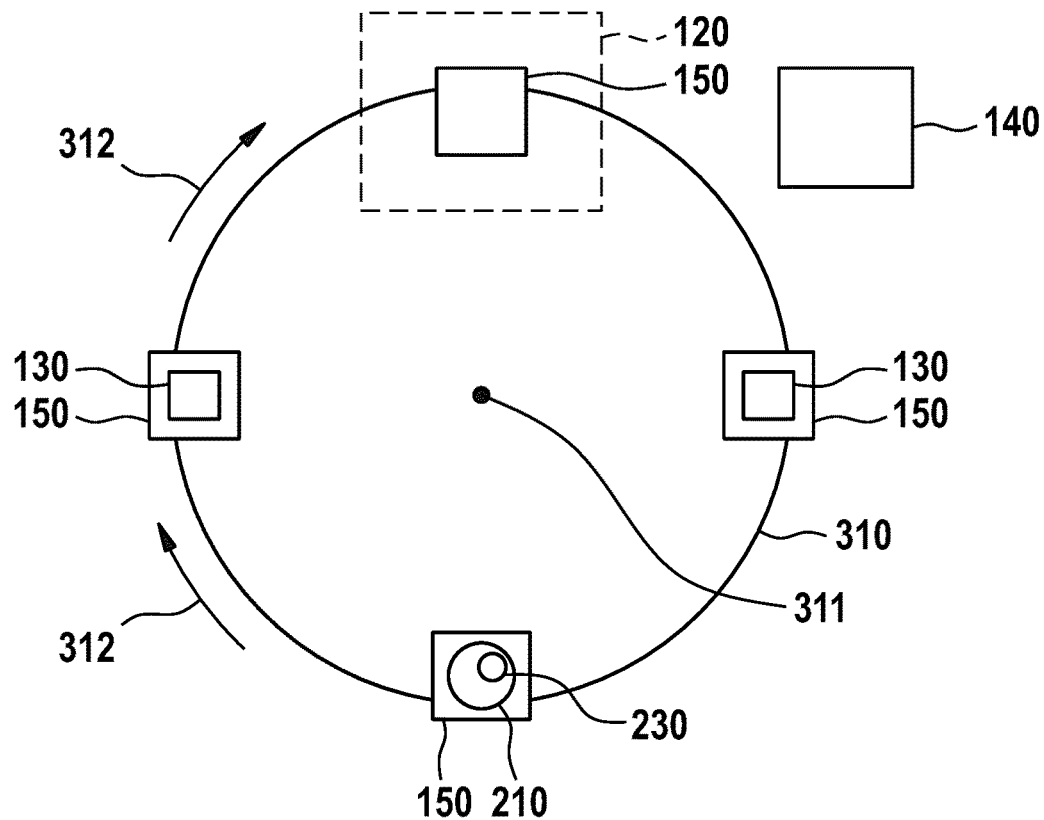
FIG. 5 shows a schematic view of an exemplary embodiment of an apparatus for producing semiconductor cells

According to a further embodiment, which can be combined with some other embodiments described herein, the transport configuration includes a rotary table wherein a printing nest is arranged on the rotary table, and the cleaning device is arranged on the printing nest. FIG. 5 shows a schematic view of an exemplary embodiment of an apparatus for producing semiconductor cells. The rotary table 310 having several printing nests 150 can be rotated around a middle point 311 for transferring the semiconductor cells 130 to the printing device 120. The cleaning device 210 can be arranged on the printing nest 150 by an operator or automatically by a cleaning support arrangement as described herein.

According to the characteristics of the semiconductor cells 130 monitored by the monitoring device 140, the cleaning device 210 is put on a printing nest 150 of the rotary table 310. According to embodiments, the monitoring device 140 can transfer information to an operator, when a cleaning device is to be put on a cleaning nest 150. Furthermore, the information of the monitoring device 140 transferred to an operator can include data about the orientation of the cleaning device 210 with respect to the nest 150, in particular about the orientation and/or positioning of a rub-unit 230 within the cleaning device 210. The operator can for example receive the information from the monitoring device from devices including augmented reality, for example a display, a headset, visual or audio signals or the like. For starting the cleaning process, the rotary table 310 is rotated by a rotational movement 312 until the cleaning device 210 is below the printing device 120. According to embodiments, which can be combined with other embodiments described herein, the cleaning device 210 can be arranged or mounted between two of the printing nests 150.

Figure 6:
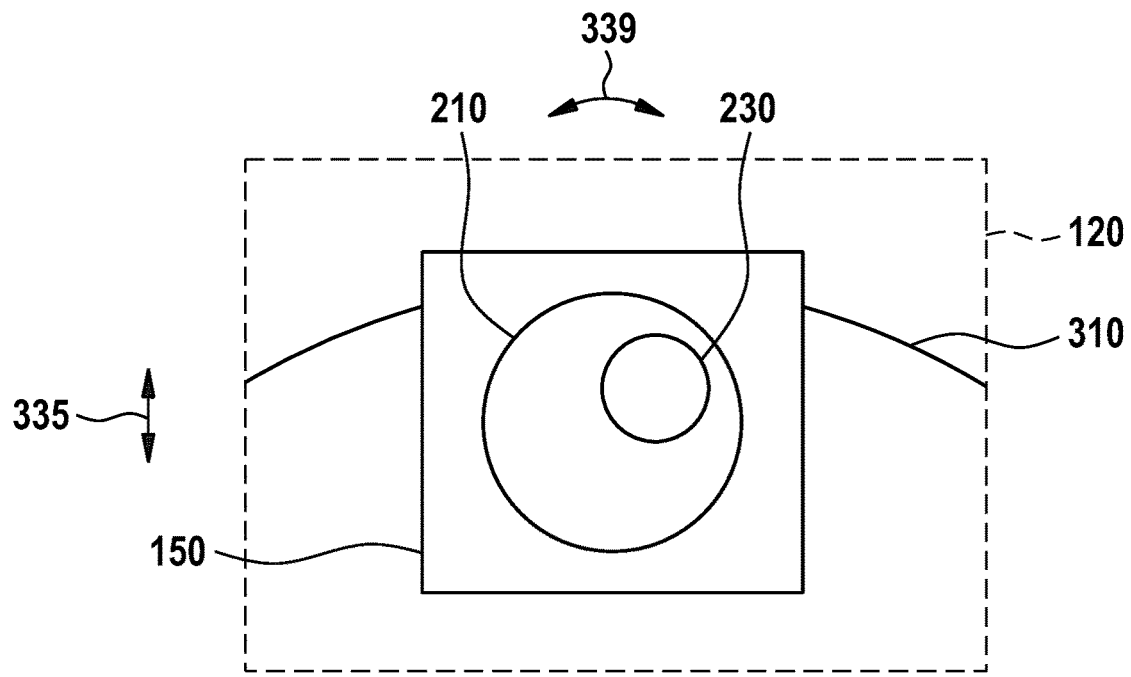
FIG. 6 shows an enlarged view of the upper part of FIG. 5.

FIG. 6 shows an enlarged view of the upper part of FIG. 5. The cleaning device 210 being arranged in the printing nest is positioned under the screen printing device 120. The cleaning process can be carried out by putting the cleaning device 210, in particular the rub-unit 230, in contact with the lower part of the printing device 120 as described herein. Furthermore, the level, in particular the height of the rotary table 310 can be raised or lowered with respect to the printing device 120, in particular to the lower side of the printing device 120 to adjust and/or adapt the distance between the cleaning device 210 and the lower side 121 of the printing device. The cleaning device 210 can be moved by a rotational movement of the rotary table 310 in a rotation direction 339, in particular a tangential direction 339 relative to the printing device. The movement of the cleaning process carried out by the cleaning device 210 can be understood as a back and forth movement in rotation direction 339, wherein the back and forth movement can be repeated more than once and the back and forth movement corresponds with the back and forth rotation movement of rotation direction 339 of the rotary table 310.

The cleaning process can further include a movement in Y-direction 335, wherein the printing device 120 is moved in Y-direction 335. By arranging the cleaning device to a printing nest on a rotary table, an already existing transport configuration can be used. Furthermore, the cleaning movement of the cleaning device can include additional tangential movements, which can improve the cleaning result.

Figure 7:
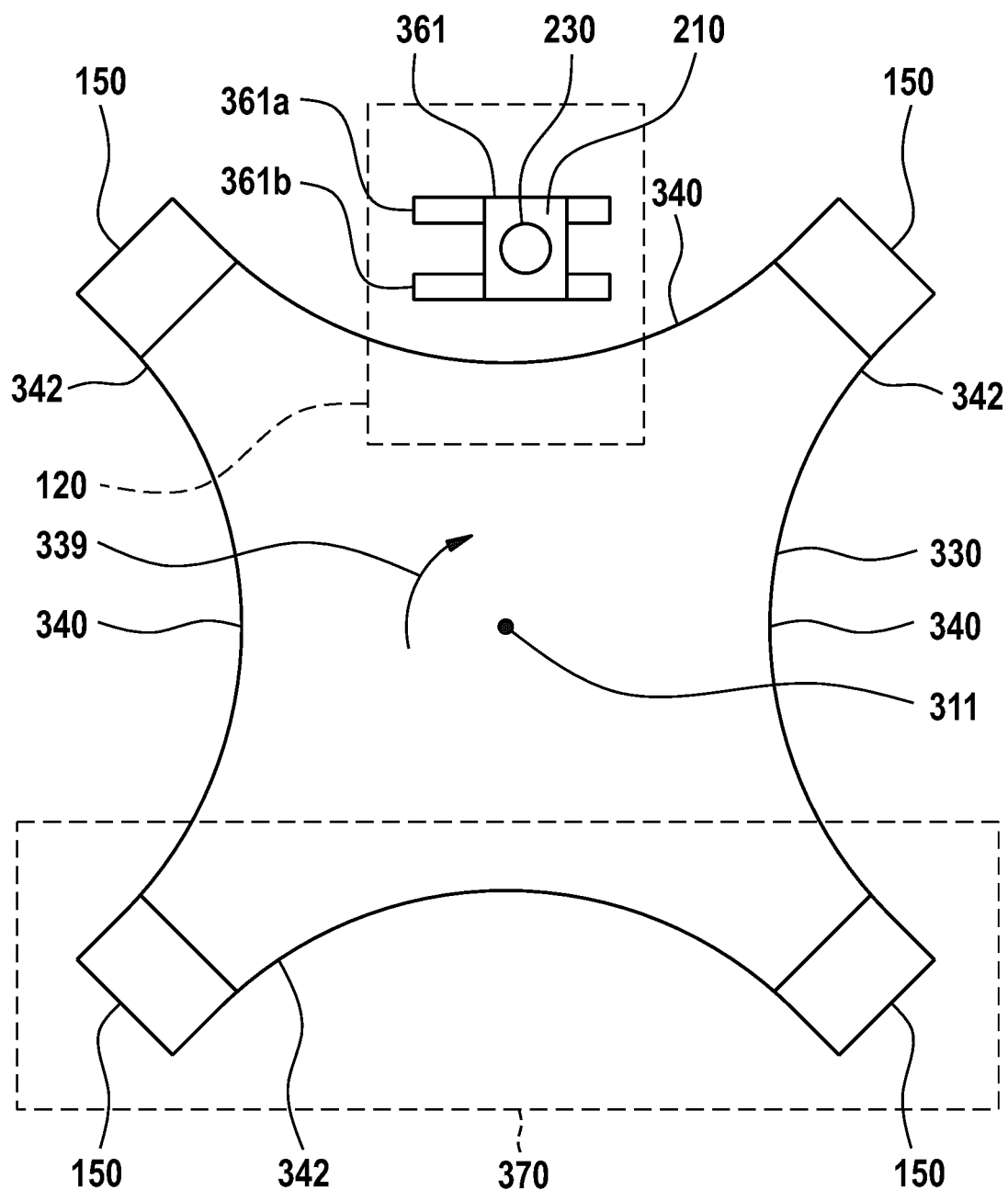
FIG. 7 shows a schematic view of a further exemplary embodiment of a transport configuration including a rotary table.

A further exemplary embodiment of a transport configuration including a rotary table is depicted schematically in FIG. 7. The rotary table 330 has a star-shaped design, in particular across-shaped design, wherein the printing nests 150 are arranged on the tips 342 of the stars-shaped or cross-shaped rotary table 330. The star-shaped or cross-shaped body of the rotary table 330 has a curved shape, wherein concavities 340 or recesses 340 on the side areas located between the tips 342 of the rotary table 330 are provided.

The cleaning device 210 can be arranged within one recess 340, wherein the cleaning device 210 is guided by a sliding or guiding system 361. According to embodiments, the cleaning device 210 can be arranged below the printing device 120, wherein the rotary table 330 can be in a cleaning position. The cleaning position can be understood as a position, wherein a recess 340 of the rotary table 330 is positioned under the printing device 120. For cleaning, the rotary table 330 can be stopped in the cleaning position, wherein the printing device 120 is located above a recess 340 of the rotary table 330. The recess 340 of the rotary enables the cleaning device 210 to be arranged below the printing device 120 by the guiding system 361 having guiding rails 361a and 361b. Arranging the cleaning device 210 with a guiding system 361 below the printing device 120 as described herein can enable a fully automatic cleaning process. A fully automatic cleaning process lowers the downtime of the apparatus for producing semiconductor cells by reducing the time needed for arranging the cleaning device below the printing device. Furthermore, the curved design of the rotary table 310 enables a high rotation speed due to the low-mass that goes along with the curved design of the rotary table 330. According to embodiments, which can be combined with other embodiments described herein, the cleaning device 210 can be arranged or mounted at the rotary table, in particular between two of the printing nests 150. The cleaning device 210 can be arranged or mounted or attached or fixed at a cleaning device support, wherein the cleaning device support is arranged within a recess 340 of the rotary table 330. A cover 370 is arranged on the rotary table 330, in particular below on side of the rotary table to enable a safe working environment for operators doing maintenance work for example on the transport configuration, in particular on the rotary table.

Figure 8:
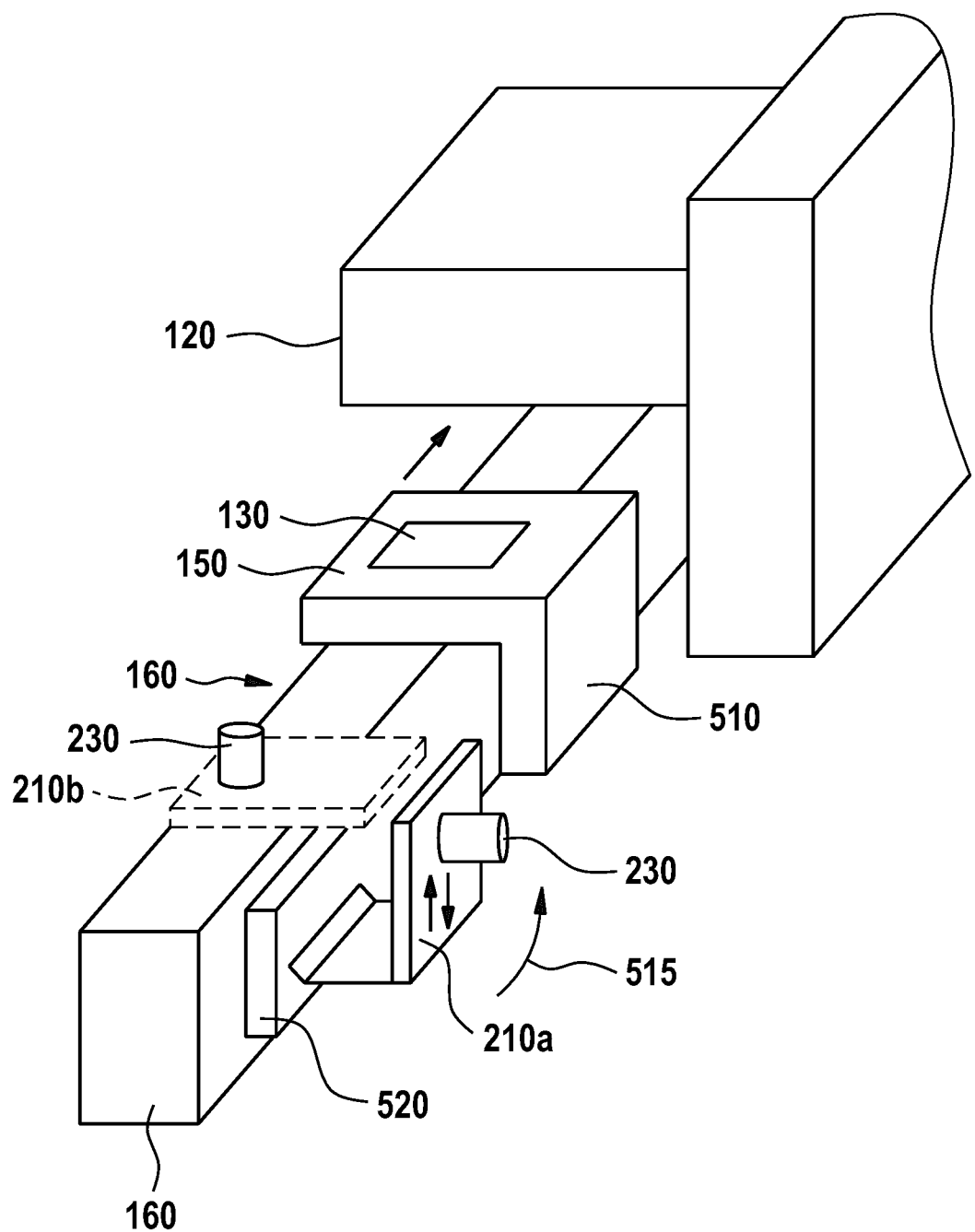
FIG. 8 shows a schematic view of another embodiment of a semiconductor cell production apparatus including a transport configuration with a shuttle track 160.

FIG. 8 shows a schematic view of another embodiment of a semiconductor cell production apparatus including a transport configuration with a shuttle track 160. The cleaning device 210a is arranged on one side of the shuttle dreck 160. The cleaning device 210a is arranged in a "stored" or inactive position on a fold mechanism 520. The inactive position can be also understood as a "pick-&-place" position, as described herein. Based on monitored characteristics of printed semiconductor cells as described herein, the cleaning device 210a can be automatically triggered by the monitoring device (not shown), wherein the cleaning device 210a is "unfolded" by transferring the cleaning device 210a from the folded position of the cleaning device 210a to an unfolded position of the cleaning device 210b along a folding direction 515.

The cleaning device can be understood as a cleaning shuttle 210b, which is put on the track 160 based on the monitored characteristics of the semiconductor cells 130 as described herein. The cleaning shuttle 210b can clean the printing device 120 as described in embodiments herein. Furthermore, the cleaning shuttle 210b can provide individual cleaning movements of the rub-unit 230, by including one or more actuators (not shown) within the cleaning shuttle configured to move the rub-unit 230 on the surface of the cleaning shuttle 210b. The actuators for example can provide additional movement directions for the rub-unit 230, which can support or enhance the cleaning movements of the cleaning shuttle along the track 160 as described herein. Using a cleaning shuttle as a cleaning device can enable a fully automatic cleaning of the printing device which reduces the time for the overall cleaning process.

According to embodiments, which can be combined with other embodiments described herein, the monitoring device is configured to divide the semiconductor cells in sections and configured to monitor the characteristic of at least one section of the semiconductor cell, wherein one of the at least one part of the printing device correspond to the sections of the cell. Dividing the semiconductor cells in to sections can be understood such that the monitoring device subdivide, or partition the semiconductor cell into different sections, wherein the monitor device determines sections or sectors within the semiconductor cell. The term divide can be understood as the semiconductor cell is allocated arithmetically in sections or sectors by the monitoring device. Dividing the semiconductor cells in to sections, in particular the dividing procedure can be carried out in a virtual way by monitoring the cell, for example using a laser, a laser unit, an optical inspection unit, an optical vision system or a scanner unit, wherein the monitored semiconductor cell remains unaffected and intact. The characteristics of the semiconductor cell in the sections can be monitored, wherein for at least one sector of the semiconductor cell an individual characteristic can be recorded.

The term "monitoring the characteristics of at least one section of the cell" can be understood as the characteristics of the semiconductor cell in some sections of all of the sections of the semiconductor cell are monitored or that the characteristics in all sections of the semiconductor cell are monitored. The term "At least one part of the printing device correspond to the sections of the cell" can be understood as components of the printing device can correspond to respective sections of the semiconductor cell. Furthermore, the term "at least one part of the printing device" can also be understood in that at least one part of a screen or a mask can correspond to sections of the semiconductor cell or can be linked to sections of the semiconductor cell. By linking a semiconductor cell section to a corresponding part of the printing device, in particular to a screen of the printing device, defects in the printing process can be detected by monitoring the characteristics of the semiconductor cell as described herein and can be linked to components, in particular to corresponding areas of the screen. Impurities, dirt or clogged areas of the screen can be recognized and localized better and more quickly, wherein an efficient cleaning can be carried out by the cleaning device as described herein.

Figure 2C:
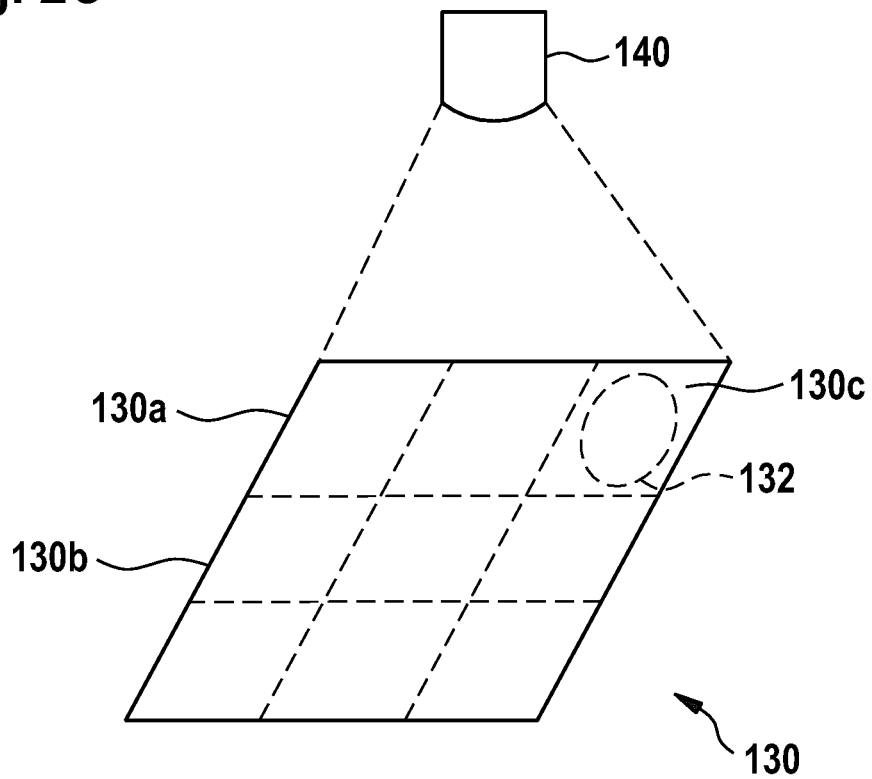
FIG. 2C shows a schematic view of an exemplary dividing process of a semiconductor cell.

In FIG. 2C, a schematic view of an exemplary dividing process a semiconductor cell is illustrated. The monitoring device 140, for example a laser scanner, divides the semiconductor cell 130 in a plurality of sections 130a, 130b, 130c. The dividing process of the monitoring device can be done virtually without having a physical impact for the cell. The monitoring device is configured to monitor the characteristics as described herein, wherein defects of the semiconductor cell in a specific section 130, in this example section 130c, are detected by monitoring the characteristic of the semiconductor cell in this section. The specific section 130c corresponds to a specific area on the printing screen, wherein the specific area of the printing screen can be determined for cleaning. Defects 132 on the printed semiconductor cell can be caused by clogged up or blocked areas of openings or apertures or holes of the screen. The cleaning process can be limited to just clean the determined areas on the screen, or just to clean the determined areas more carefully, which can be understood as cleaning more intensively for example with more pressure, or more repetitions. The cleaning device can be adjusted to just clean or to clean intensively the determined areas on the screen by aligning for example, the position of a rub-unit of the cleaning device with the detected section 130c of the semiconductor cell having the defect 132.

According to embodiments, which can be combined with other embodiment described herein, the cleaning device can have the same size as a semiconductor cell, wherein a rub unit is arranged on the cleaning device, wherein the position of the detected defects on the semiconductor cell is similar to the position of the rub unit on the cleaning device. Defects can include dirt, inadequate paste, or interruptions of printed patterns. Furthermore, the monitoring device can clean the respective areas of the screen more frequently, which can be understood such that the rub-unit is passing the clogged up areas of the screen more frequently than other areas of the screen. The cleaning process can be carried out more focused and more purposefully, which can lead to better cleaning results and to a reduced cleaning time.

Figure 9A:
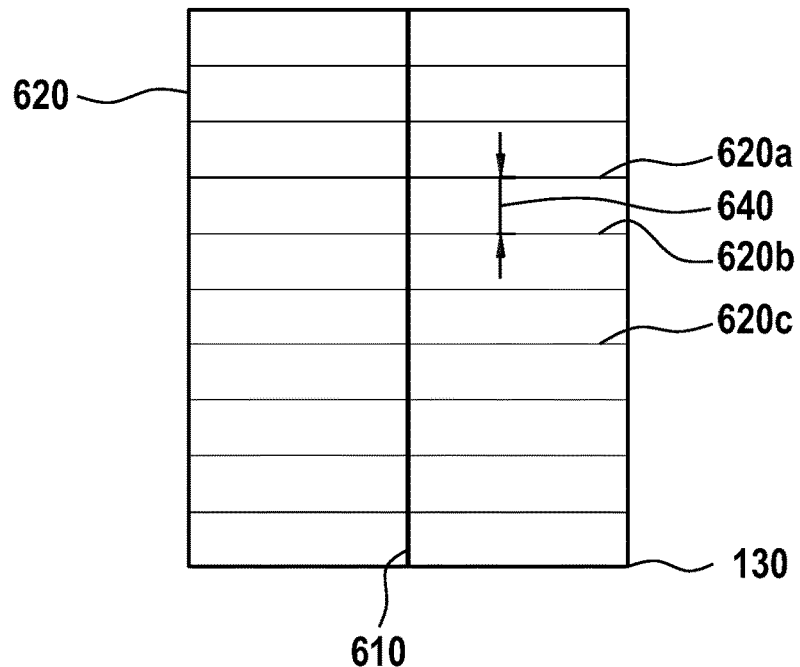
FIG. 9A shows a schematic view of a semiconductor cell printed by a printing device.

According to embodiments, which can be combined with other embodiments described herein, the characteristics of the semiconductor cell include finger interruptions. Finger interruptions are printed on a semiconductor cell, in particular on a solar cell. In FIG. 9A, a schematic view of a semiconductor cell 130 printed by a printing device is shown. The semiconductor cell 130 includes a bus bar 610, which is connected to a plurality of fingers 620, in particular or example 620a, 620b and 620c. The distance 640 between two adjacent fingers 620a and 620b is critical for the performance of the semiconductor cell 130, in particular of the solar cell 130. In this depicted example, the fingers do not include interruptions.

Figure 9B:
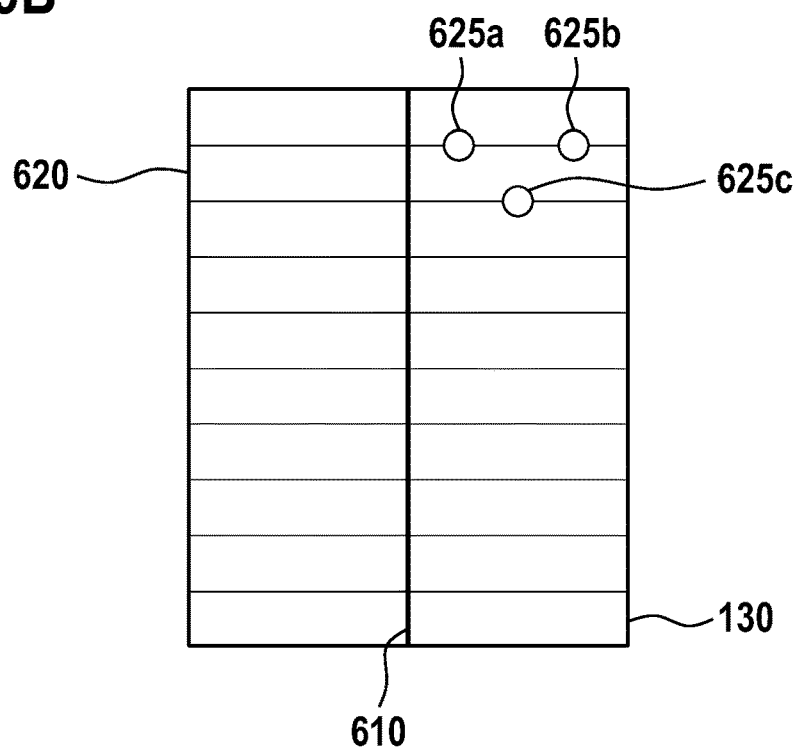
FIG. 9B shows an enlarged view of a solar cell similar to the previous example depicted in FIG. 9a comprising finger interruptions.

FIG. 9B shows an enlarged view of a semiconductor cell 130, in particular of a solar cell 130 similar to the previous example, wherein the semiconductor cell 130 has finger interruptions 625a, 625b, 625c within fingers 620 connected to the bus bar 610. The finger interruptions can be caused by a dirty or soiled printing device. In particular, the screen or the mask of the printing device can be at least partly clogged up, wherein the paste to be applied to a semiconductor cell cannot be applied correctly and finger interruptions can occur on the semiconductor cell. By monitoring the finger interruptions on a printed cell, the cleaning of the printing device can be triggered or initiated as described in embodiments herein. The smaller the distance 640 between two adjacent fingers, for example the adjacent fingers 620a and 620b, the finer screen openings or apertures or holes are used, wherein more cleaning is needed. By monitoring the finger interruptions of the cell, the quality of the semiconductor cell can be measured based on the interrupted fingers and the cleaning process can be triggered very accurately.

According to embodiments, which can be combined with other embodiments described herein, the cleaning device includes a rub-unit. A rub-unit can also be understood as rub head, wherein the rub-unit can consist of at least one of the following materials: Tissue, rubber, fabric, textile or the like. The rub-unit is arranged on the cleaning device, wherein the position of the rub-unit can be configured to one of at least one part of the printing device. Furthermore, the position of the rub-unit can be adjusted based on the monitored characteristic of the semiconductor cell. The adjustment can be done by an operator or automatically by a cleaning support arrangement as described herein. The rub-unit can be held onto a protrusion, in particular onto a cylindrical protrusion, wherein the protrusion has for example a diameter of 40 mm to 60 mm. The cylindrical protrusion can be fixed on a surface of the cleaning device.

According to embodiments, a cleaning device for cleaning a printing device is arrangeable at a semiconductor cell support as described herein. According to embodiments, the cleaning device is configured to clean at least one part of the printing device, the at least one part of the printing device corresponding to at least one section of the semiconductor cells.

According to embodiments, a method for cleaning a printing device in a semiconductor cell production apparatus is provided, wherein the method includes monitoring characteristics of semiconductor cells, and cleaning at least one part of the printing device based on the monitored characteristics. According to embodiments, the monitoring can be supported by an operator. The monitoring can include entering visual parameters, wherein the visual parameters are sensed by an operator, in particular a human person. The characteristics of the semiconductor cell can include visual parameter sensed by the operator.

According to embodiments, a method is provided, wherein the method includes dividing the semiconductor cells in to sections via the monitoring, assigning the sections to parts of the printing device and cleaning the parts of the printing device assigned to the sections of the semiconductor device based on the monitored characteristics of the sections of the semiconductor cell. According to embodiments, the monitoring includes detecting finger interruptions of the cell. According to embodiments, the method includes arranging a cleaning device on a semiconductor cell support, and transferring the semiconductor cell support to the printing device. According to embodiments, the cleaning includes moving a rub unit, wherein the rub-unit is moved by a transporting configuration for transporting the semiconductor cells, in particular for transporting the semiconductor cell support to the printing device.

Figure 10:
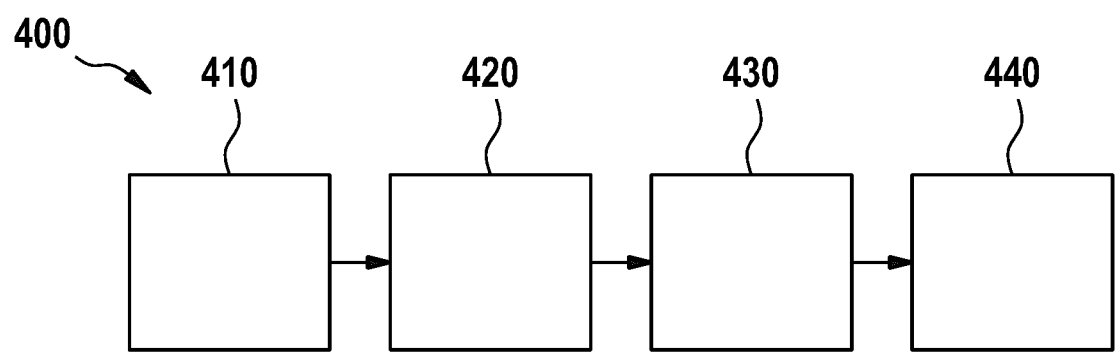
FIG. 10 shows a flow chart of a method for cleaning a printing device of a semiconductor cell apparatus.

FIG. 10 describes a flow chart of a method for cleaning a printing device of a semiconductor cell apparatus, according to embodiments described herein. The method 400 includes printing 410 a semiconductor cell, monitoring the characteristics of a printed semiconductor cell 420, cleaning the printing device 430 based on the monitored characteristics of the printed semiconductor cell, and further printing a semiconductor cell 440. The above described method can be repeated over and over again. The method depicted in FIG. 10 can enable a closed loop printing process, wherein the cleaning process is improved from cycle to cycle, by monitoring the characteristics of the semiconductor cell after the preceding cleaning process and adapting the following cleaning process for example by refining the position of the cleaning device with respect to the screen printer as described herein, or by adjusting the repetitions or the movement of the cleaning device with respect to the printing device, in particular to the screen of the printing device.

The embodiments of the present disclosure allow for improving the cleaning process of a printing device. The cleaning, in particular the cleaning process or procedure can be improved by cleaning the printing device based on the monitored characteristics of the semiconductor cell as describe herein. In particular, the cleaning time can be reduced by just cleaning the parts or components of the printing device causing the characteristics of the printed semiconductor cell. Furthermore, the cleaning can be more efficient through monitoring of the characteristics of the printed cells and near-term cleaning of impurities of the parts or components of the printing device. Moreover, the quality of the semiconductor cell can be improved. The cleaning device as described above can also save time and costs by producing less scrap. The cleaning process can be carried out semi-automatically which enables an inexpensive improvement of the cleaning process. The cleaning process according to embodiments described herein can be fully automatic, which can speed up the cleaning process and lower the downtime of the printing apparatus during the cleaning process.

While the foregoing is directed to some embodiments, other and further embodiments may be devised without departing from the basic scope, and the scope is determined by the claims that follow.

The invention claimed is:

1. A method for cleaning a printing device in a semiconductor production apparatus, the method comprising:
   monitoring characteristics of semiconductor cells, and
   cleaning at least one part of a screen or a mask of the printing device based on the monitored characteristics,
   dividing a semiconductor cell of the semiconductor cells into sections via the monitoring, assigning the sections to parts of the screen or mask of the printing device, and
   cleaning at least the one part of the screen or mask of the printing device assigned to the sections of the semiconductor cells based on the monitored characteristics of the sections of the semiconductor cell;
   wherein the monitored characteristics comprises finger interruptions within fingers of the semiconductor cell and detecting finger interruptions triggers or initiates the cleaning at least the one part of the screen or mask of the printing device.

2. The method according to claim 1, the method comprising:
   arranging a cleaning device on a semiconductor cell support-, and
   transferring the semiconductor cell support to the printing device.

3. The method according to claim 1, wherein the cleaning comprises moving a rub-unit, wherein the rub-unit is moved by a transporting configuration for transporting the semiconductor cells.

4. The method according to claim 3, the method comprising:
   arranging a cleaning device on a semiconductor cell support, and
   transferring the semiconductor cell support to the printing device.

* * * * *